United States Patent
Park

(10) Patent No.: US 12,445,110 B2
(45) Date of Patent: Oct. 14, 2025

(54) ACOUSTIC WAVE FILTER

(71) Applicant: Samsung Electro-Mechanics Co., Ltd., Suwon-si (KR)

(72) Inventor: Chanhee Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 235 days.

(21) Appl. No.: 18/321,187

(22) Filed: May 22, 2023

(65) Prior Publication Data

US 2024/0186982 A1    Jun. 6, 2024

(30) Foreign Application Priority Data

Dec. 6, 2022    (KR) .......................... 10-2022-0169136

(51) Int. Cl.
*H03H 9/56*    (2006.01)
*H03H 9/54*    (2006.01)

(52) U.S. Cl.
CPC ............ *H03H 9/568* (2013.01); *H03H 9/542* (2013.01)

(58) Field of Classification Search
CPC ...... H03H 9/6483; H03H 9/568; H03H 9/605; H03H 9/542; H03H 9/205; H03H 9/547
See application file for complete search history.

(56) References Cited

U.S. PATENT DOCUMENTS

| | | | |
|---|---|---|---|
| 10,965,273 B2* | 3/2021 | Pang .................... | H03H 9/6483 |
| 2007/0052494 A1* | 3/2007 | Shibagaki .............. | H03H 9/605 |
| | | | 333/195 |
| 2010/0110940 A1* | 5/2010 | Hara ....................... | H03H 9/725 |
| | | | 333/133 |
| 2012/0286896 A1 | 11/2012 | Takamine | |
| 2019/0253037 A1* | 8/2019 | Konaka .................. | H03H 9/725 |
| 2020/0119716 A1* | 4/2020 | Kim ........................ | H03H 9/568 |
| 2020/0295734 A1 | 9/2020 | Urata | |

(Continued)

FOREIGN PATENT DOCUMENTS

| | | |
|---|---|---|
| JP | 7132944 B2 | 9/2022 |
| KR | 10-1387447 B1 | 4/2014 |

(Continued)

OTHER PUBLICATIONS

Komatsu, Tomoya, et al., "Design of Narrow Bandwidth Ladder-type Filters with Sharp Transition Bands Using Mutually Connected Resonator Elements", *IEEE transactions on ultrasonics, ferroelectrics, and frequency control* vol. 56. Issue 7 (2009). p. 1576-1759.

(Continued)

*Primary Examiner* — John W Poos
(74) *Attorney, Agent, or Firm* — NSIP Law

(57) ABSTRACT

An acoustic wave filter includes: a plurality of first series resonators connected in series between a first port and a second port; a plurality of shunt resonators, each shunt resonators being connected between a different node disposed between the first port and the second port and the ground; at least one second series resonator connected in parallel to at least one of the first series resonators; and an inductor connected between one of the shunt resonators and the ground. A resonant frequency of the shunt resonator connected to the inductor is the same as a resonant frequency of at least one of the plurality of first series resonators.

10 Claims, 9 Drawing Sheets

(56) References Cited

U.S. PATENT DOCUMENTS

2021/0297063 A1  9/2021 Sung et al.
2021/0313964 A1  10/2021 Sung et al.
2022/0158620 A1* 5/2022 Park .................. H03H 9/17

FOREIGN PATENT DOCUMENTS

KR  10-2019-0065401 A   6/2019
KR     10-2066958 B1    1/2020
KR  10-2021-0122478 A  10/2021

OTHER PUBLICATIONS

Korean Office Action issued on Jun. 13, 2024, in counterpart Korean Patent Application No. 10-2022-0169136 (4 pages in English, 4 pages in Korean).
Korean Office Action issued on Dec. 20, 2024, in counterpart Korean Patent Application No. 10-2022-0169136 (1 page in English, 2 pages in Korean).

* cited by examiner

ACOUSTIC WAVE FILTER

CROSS-REFERENCE TO RELATED APPLICATION

This application claims priority to and the benefit under 35 USC 119(a) of Korean Patent Application No. 10-2022-0169136 filed in the Korean Intellectual Property Office on Dec. 6, 2022, the entire contents of which are incorporated herein by reference for all purposes.

BACKGROUND

Field

The following description relates to an acoustic wave filter.

Description of the Background

With the rapid development of mobile communication devices, chemical and biological devices, and the like, demand for small and lightweight filters, oscillators, resonant elements, and acoustic resonant mass sensors used in these devices is increasing.

Acoustic resonators such as bulk acoustic wave (BAW) filters are used to implement the small and lightweight filters, oscillators, resonance elements, acoustic resonance mass sensors, and the like, and since they are very small in size and have good performance (for example, a wide pass bandwidth) compared to dielectric filters, metal cavity filters, wave guides, and the like, they are widely used in communication modules of mobile devices that require good performance.

On the other hand, the BAW filter is relatively poor in terms of RF performance compared to the other filters above. For example, the metal cavity filter or the wave guide may implement low-loss and high-skirt characteristics according to an increase in bandwidth, but the BAW filter is relatively difficult to implement compared to them. Therefore, a structure capable of realizing low-loss and high-skirt characteristics of the BAW filter is required.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter includes: a plurality of first series resonators connected in series between a first port and a second port; a plurality of shunt resonators, each shunt resonators being connected between a different node disposed between the first port and the second port and the ground; at least one second series resonator connected in parallel to at least one of the first series resonators; and an inductor connected between one of the shunt resonators and the ground. A resonant frequency of the shunt resonator connected to the inductor is the same as a resonant frequency of at least one of the plurality of first series resonators.

A resonant frequency of the at least one second series resonator may be smaller than a resonant frequency of at least one of the first series resonators.

A resonant frequency of the at least one second series resonator may be the same as a resonant frequency of at least one of the shunt resonators except for the shunt resonator connected to the inductor.

A resonant frequency of the shunt resonator connected to the inductor may be larger than a resonant frequency of at least one of the shunt resonators except for the shunt resonator connected to the inductor.

The at least one second series resonator may include two second series resonators, and each of the second series resonators may be connected to a different first series resonators among the first series resonators.

In another general aspect, an acoustic wave filter includes: a second series resonator connected in parallel to one of a plurality of first series resonators connected in series to each other between a first port and a second port; and an inductor connected between the ground and a first shunt resonator among a plurality of shunt resonators connected between a plurality of nodes between the first port and the second port and the ground, wherein a resonant frequency of the second series resonator is the same as a resonant frequency of at least one of the plurality of shunt resonators except for the first shunt resonator.

A resonant frequency of the first shunt resonator may be the same as a resonant frequency of the one first series resonator connected to the second series resonator.

The resonant frequency of the second series resonator may be smaller than a resonant frequency of one first series resonator connected to the second series resonator.

A resonant frequency of the first shunt resonator may larger than a resonant frequency of at least one of the shunt resonators except for the first shunt resonator.

The acoustic wave filter may further include a third series resonator connected in parallel to another one of the plurality of first series resonators, and a resonant frequency of the third series resonator may be the same as a resonant frequency of at least one of the shunt resonators except for the first shunt resonator.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

Figure 1:
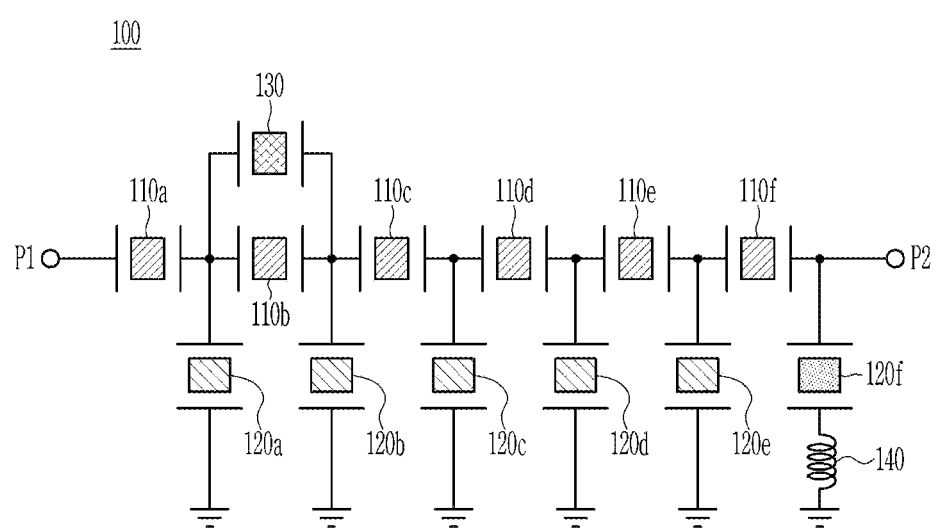
FIG. 1 illustrates a circuit diagram of an acoustic wave filter according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Herein, a radio frequency (RF) signal includes Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but are not limited thereto.

Figure 2:
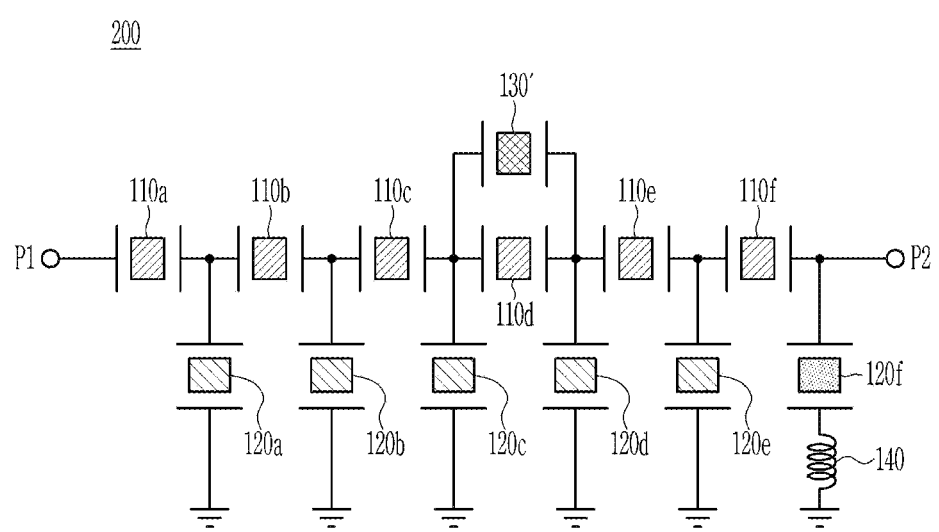
FIG. 2 illustrates a circuit diagram of an acoustic wave filter according to another example.

FIG. 1 illustrates a circuit diagram of an acoustic wave filter according to an example, and FIG. 2 illustrates a circuit diagram of an acoustic wave filter according to another example.

Referring to FIG. 1, an acoustic wave filter 100 may pass a main frequency band from an input RF signal. The acoustic wave filter 100 may pass a main frequency band from an RF signal inputted to a port P1 to output it to a port P2.

The acoustic wave filter 100 includes a plurality of first series resonators 110a, 110b, 110c, 110d, 110e, and 110f, a plurality of shunt resonators 120a, 120b, 120c, 120d, 120e, and 120f, a second series resonator 130, and an inductor 140. Although FIG. 1 shows six first series resonators 110a, 110b, 110c, 110d, 110e, and 110f and six shunt resonators 120a, 120b, 120c, 120d, 120e, and 120f configuring the acoustic wave filter 100, the numbers of the first series resonators and the shunt resonators configuring the acoustic wave filter 100 are not limited thereto. For example, the acoustic wave filter 100 may include at least two first series resonators and at least two shunt resonators.

The plurality of first series resonators 110a, 110b, 110c, 110d, 110e, and 110f may be connected in series between the ports P1 and P2.

The plurality of shunt resonators 120a, 120b, 120c, 120d, 120e, and 120f may be connected between different nodes between the ports P1 and P2 and the ground. According to the example of FIG. 1, the shunt resonator 120a is connected between a node between the first series resonator 110a and the first series resonator 110b and the ground. The shunt resonator 120b is connected between a node between the first series resonator 110b and the first series resonator 110c and the ground. The shunt resonator 120c is connected between a node between the first series resonator 110c and the first series resonator 110d and the ground. The shunt resonator 120d is connected between a node between the first series resonator 110d and the first series resonator 110e and the ground. The shunt resonator 120e is connected between a node between the first series resonator 110e and the first series resonator 110f and the ground. The shunt resonator 120f is connected between a node between the first series resonator 110f and the port P2 and the ground.

The second series resonator 130 may be connected in parallel to one of the plurality of first series resonators 110a, 110b, 110c, 110d, 110e, and 110f connected in series between the ports P1 and P2. As an example, as shown in FIG. 1, the second series resonator 130 may be connected in parallel to the first series resonator 110b. As another example, as shown in FIG. 2, a second series resonator 130' may be connected in parallel to the first series resonator 110d. An acoustic wave filter 200 shown in FIG. 2 is the same as the acoustic wave filter 100 shown in FIG. 1, except that the position of the second series resonator 130' is different from the position of the second series resonator 130 of the acoustic wave filter 100 shown in FIG. 1.

The inductor 140 may be connected in series between one of the plurality of shunt resonators 120a, 120b, 120c, 120d, 120e, and 120f and the ground. As an example, the inductor 140 may be connected in series between the shunt resonator 120f connected to the port P2 and the ground. As another example, the inductor 140 may be connected in series between the shunt resonator 120e and the ground.

In the acoustic wave filters 100 and 200 shown in FIG. 1 and FIG. 2, the first series resonators 110a, 110b, 110c, 110d, 110e, and 110f, the second series resonators 130 and 130', and the shunt resonators 120a, 120b, 120c, 120d, 120e, and 120f may have a piezoelectric characteristic. The acoustic wave filters 100 and 200 shown in FIG. 1 and FIG. 2 may be bulk acoustic wave (BAW) filters. Alternatively, the acoustic wave filters 100 and 200 shown in FIG. 1 and FIG. 2 may be surface acoustic wave (SAW) filters.

In the acoustic wave filters 100 and 200 shown in FIG. 1 and FIG. 2, at least two of the first series resonators 110a, 110b, 110c, 110d, 110e, and 110f may have the same resonance frequency. As an example, the resonant frequencies of the first series resonators 110a, 110b, 110c, 110d, 110e, and 110f may be the same.

In the acoustic wave filters 100 and 200 shown in FIG. 1 and FIG. 2, at least two of the shunt resonators 120a, 120b, 120c, 120d, and 120e may have the same resonance frequency. As an example, the resonance frequencies of the shunt resonators 120a, 120b, 120c, 120d, and 120e may be the same.

In the acoustic wave filters 100 and 200 shown in FIG. 1 and FIG. 2, the resonance frequency of the shunt resonator 120f to which the inductor 140 is connected may be different from the resonance frequency of the shunt resonators 120a, 120b, 120c, 120d, and 120e.

In the acoustic wave filters 100 and 200 shown in FIG. 1 and FIG. 2, the resonance frequency of the first series resonators 110a, 110b, 110c, 110d, 110e, and 110f, the resonance frequency of the shunt resonators 120a, 120b, 120c, 120d, and 120e, and the resonance frequency of the shunt resonator 120f may have a relationship of Equation 1.

$$Fsh < Fsh\_L = Fse \quad \text{(Equation 1)}$$

In Equation 1, Fse represents the resonance frequency of the first series resonators 110a, 110b, 110c, 110d, 110e, and 110f, Fsh represents the resonance frequency of the shunt resonators 120a, 120b, 120c, 120d, and 120e, and Fsh_L represents the resonance frequency of the shunt resonator 120f to which the inductor 140 is connected.

According to the examples, as shown in Equation 1, the resonance frequency of the shunt resonator 120f to which the inductor 140 is connected may be set to be the same as the resonance frequency of at least one of the first series resonators 110a, 110b, 110c, 110d, 110e, and 110f. As such, by setting the resonance frequency of the shunt resonator 120f to which the inductor 140 is connected to be the same as the resonance frequency of at least one of the first series resonators 110a, 110b, 110c, 110d, 110e, and 110f, the inband flatness performance may be improved, and this effect will be described later with reference to FIG. 4 and FIG. 6.

In addition, in the acoustic wave filters 100 and 200 shown in FIG. 1 and FIG. 2, the resonance frequency of the second series resonators 130 and 130' may have a relationship of Equation 2 and Equation 3.

$$Fse\_a < Fse \quad \text{(Equation 2)}$$

$$Fse\_a = Fsh \quad \text{(Equation 3)}$$

As shown in Equation 2, the resonant frequency of the second series resonators 130 and 130' may be set smaller than the resonant frequency of the first series resonator 110b. Particularly, the resonance frequency of the second series resonators 130 and 130' may be set so that an active area of the second series resonators 130 and 130' and an active area of the first series resonator 110b do not overlap. The active area may refer to an area between a resonance point and an anti-resonance point of a corresponding resonator.

According to the examples, as in Equation 3, the resonant frequency of the second series resonators 130 and 130' may be set to be the same as the resonant frequency of the shunt resonators 120a, 120b, 120c, 120d, and 120e. In this way, by setting the resonant frequency of the second series resonators 130 and 130' to be the same as the resonant frequency of the shunt resonators 120a, 120b, 120c, 120d, and 120e, the acoustic wave filters 100 and 200 may have a pass bandwidth with an excellent skirt characteristic. This effect will be described later with reference to FIG. 3 and FIG. 6.

Since the effect obtained by the acoustic wave filter 100 shown in FIG. 1 and the effect obtained by the acoustic wave filter 200 shown in FIG. 2 are the same, the acoustic wave filter 100 shown in FIG. 1 will be described as a reference.

Figure 3:
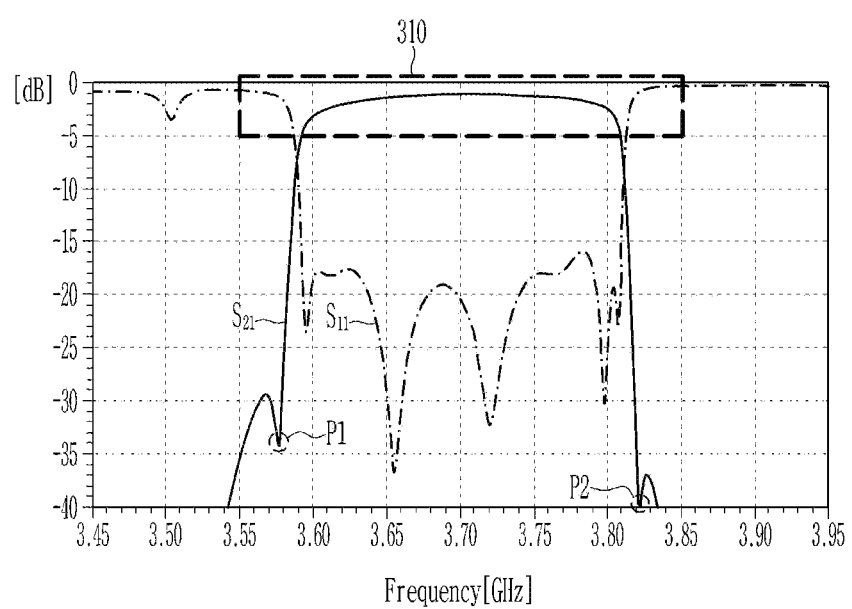
FIG. 3 illustrates a graph of simulation results for reflection loss and insertion loss of the example shown in FIG. 1.
Figure 4:
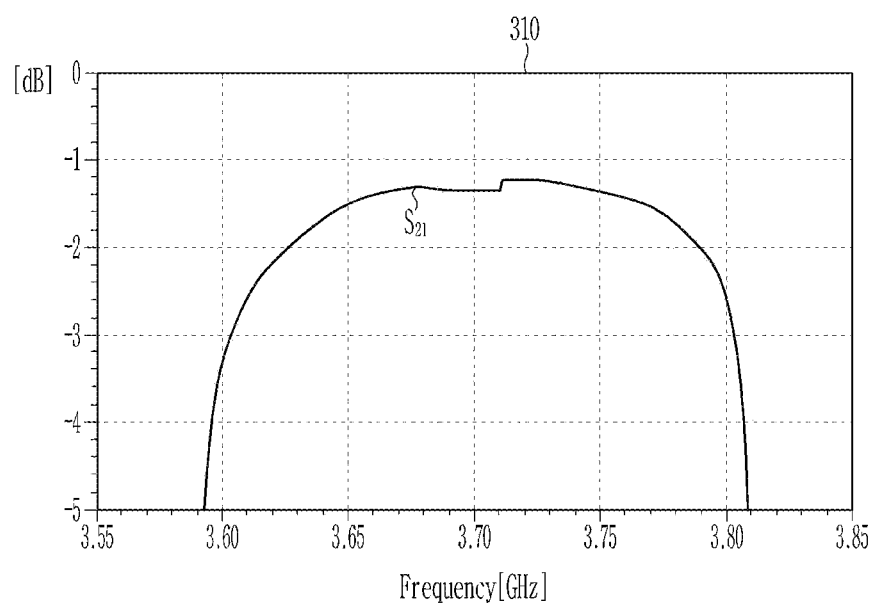
FIG. 4 illustrates an enlarged diagram of insertion loss of a partial section in the graph shown in FIG. 2.

FIG. 3 illustrates a graph of simulation results for reflection loss and insertion loss of the example shown in FIG. 1, and FIG. 4 illustrates an enlarged diagram of insertion loss of a partial section in the graph shown in FIG. 2.

In FIG. 3, a partial section 310 represents an insertion loss of a 0 to −5 dB section for an entire frequency band, and the partial section 310 is enlarged and shown in FIG. 4.

Figure 5:
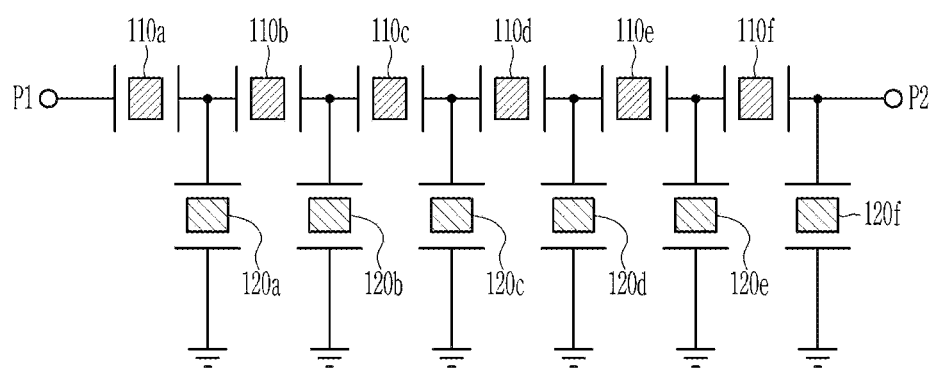
FIG. 5 illustrates a circuit diagram of an acoustic wave filter of a comparative example for comparison with the example shown in FIG. 1.

FIG. 5 illustrates a circuit diagram of an acoustic wave filter of a comparative example for comparison with the example shown in FIG. 1.

Referring to FIG. 5, an acoustic wave filter 500 of a comparative example is a typical ladder-type acoustic wave filter configured of six first series resonators and six shunt resonators connected in series between two ports P1 and P2. That is, the acoustic wave filter 500 of the comparative example is an acoustic wave filter without the second series resonator 130 and the inductor 140 in the acoustic wave filter 100 shown in FIG. 1.

Figure 6:
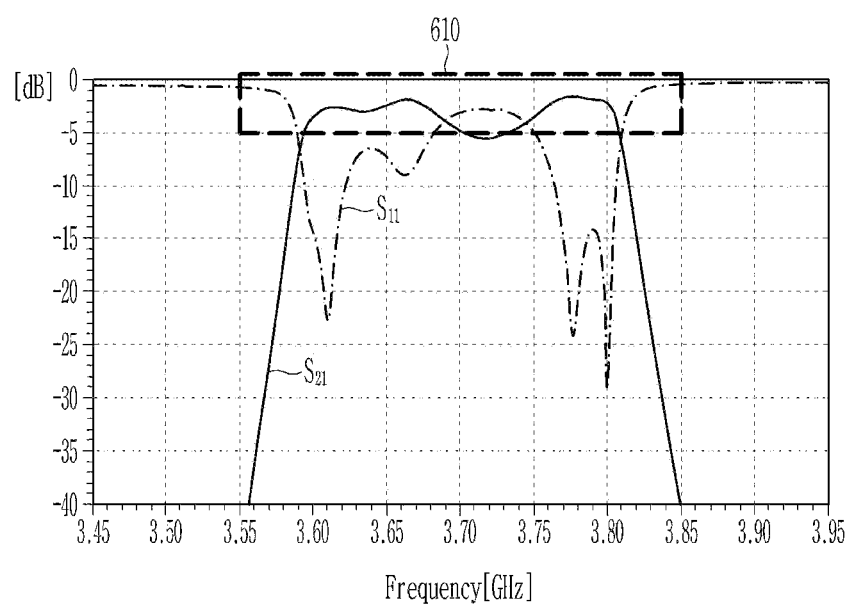
FIG. 6 illustrates a graph of simulation results for reflection loss and insertion loss of the comparative example shown in FIG. 5.
Figure 7:
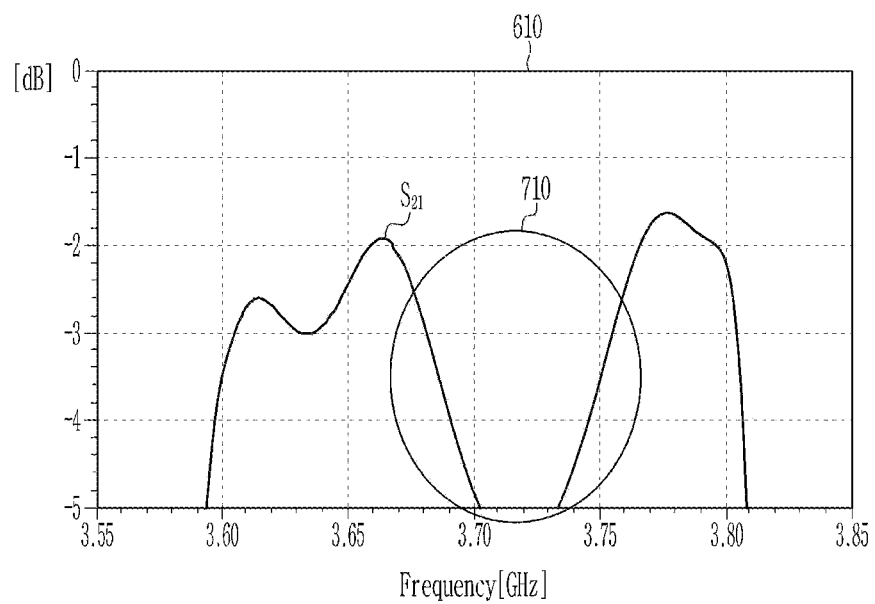
FIG. 7 illustrates an enlarged diagram of insertion loss of a partial section in the graph shown in FIG. 6.

FIG. 6 illustrates a graph of simulation results for reflection loss and insertion loss of the comparative example shown in FIG. 5, with a partial section 610 representing an insertion loss of a 0 to −5 dB section for an entire frequency band, and FIG. 7 illustrates an enlarged diagram of insertion loss of the partial section 610 in the graph shown in FIG. 6.

First, referring to FIG. 4 and FIG. 7, it can be seen that the acoustic wave filter 100 has more excellent inband flatness than the acoustic wave filter 500 of the comparative example. Thus, the acoustic wave filter 100 may better transmit an RF signal within a passband than the acoustic wave filter 500 of the comparative example. The inband flatness represents the distribution of insertion loss S21 within the passband. It can be seen that bandwidth performance is good only when the flatness in the passband is small.

That is, in the acoustic wave filter 100, as shown in Equation 1, the resonant frequency of the shunt resonator 120f to which the inductor 140 is connected is set to be the same as the resonant frequency of at least one of the first series resonators 110a, 110b, 110c, 110d, 110e, and 110f, and the inductor 140 is connected in series between the shunt resonator 120f and the ground, so that the acoustic wave filter 100 may compensate for flatness of a frequency band 710 having poor flatness in the graph shown in FIG. 7.

For example, it is assumed that the resonant frequency of the first series resonators 110a, 110b, 110c, 110d, 110e, and 110f is set to 3.7 GHz and the resonant frequency of the shunt resonators 120a, 120b, 120c, 120d, and 120e other than the shunt resonator 120f to which the inductor 140 is connected are set to 3.5 GHz. In this case, the resonant frequency of the shunt resonator 120f to which the inductor 140 is connected is set to 3.7 GHz, which is the resonant frequency of the first series resonators 110a, 110b, 110c, 110d, 110e, and 110f. Then, a resonant point of the shunt resonator 120f is moved to the left from 3.7 GHz by the inductor 140, and accordingly, the insertion loss of the frequency band 710 between 3.7 GHz and 3.75 GHz may be compensated.

In addition, comparing FIG. 4 and FIG. 7, it can be seen that the acoustic wave filter 100 has more excellent inband flatness than the acoustic wave filter 500 of the comparative example.

Next, in the acoustic wave filter 100 shown in FIG. 1, the second series resonator 130 is connected in parallel to the first series resonator 110b, and as shown in Equation 3, the resonant frequency of the second series resonator 130 is set to be the same as that of the shunt resonators 120a, 120b, 120c, 120d, and 120e. Accordingly, the acoustic wave filter 100 shown in FIG. 1 may have an excellent skirt characteristic.

Referring to FIG. 3 and FIG. 6, the acoustic wave filter 100 shown in FIG. 1 forms poles P1 and P2 in left and right bands adjacent to the inband. Accordingly, it can be confirmed that the acoustic wave filter 100 shown in FIG. 1 has a steeper skirt than the acoustic wave filter 500 of the comparative example due to the poles formed in the left and right bands adjacent to the inband.

The resonator operates as an inductor in an active area in which resonance occurs, and operates as a capacitor in other areas.

In the case of the acoustic wave filter 100 shown in FIG. 1, the resonance frequencies of the first series resonator 110b and the second series resonator 130 are set so that the active area of the first series resonator 110b and the active area of the second series resonator 130 do not overlap each other. Particularly, as in Equation 3, the resonant frequency of the second series resonator 130 is set to be the same as the resonant frequency of the shunt resonators 120a, 120b, 120c, 120d, and 120e.

In this way, in the active area of the first series resonator 110b, the second series resonator 130 operates as a capacitor. That is, the acoustic wave filter 100 operates as if a capacitor is connected in parallel to the first series resonator 110b. Accordingly, as shown in FIG. 3, the acoustic wave filter 100 may additionally form the pole P2. For example, assuming that the anti-resonance frequency of the first series resonators 110a, 110b, 110c, 110d, 110e, and 110f is between 3.80 GHz and 3.85 GHz, while the anti-resonance frequency of the second series resonator 110b is shifted to the left, the pole P2 is formed as shown in FIG. 3.

In addition, in the active area of the second series resonator 130, the first series resonator 110b operates as a capacitor. That is, the acoustic wave filter 100 operates as if a capacitor is connected in parallel to the second series resonator 130. Accordingly, as shown in FIG. 3, the acoustic wave filter 100 may additionally form the pole P1. For example, assuming that the anti-resonance frequency of the shunt resonators 120a, 120b, 120c, 120d, and 120e is between 3.55 GHz and 3.60 GHz, while the anti-resonance frequency of the second series resonator 130 is shifted to the left, the pole P1 is formed as shown in FIG. 3.

As described above, the acoustic wave filter 100 shown in FIG. 1 forms the poles P1 and P2 in the left band and the right band adjacent to the inband, respectively, compared to the acoustic wave filter 500 of the comparative example, so that it may have better skirt characteristics than the acoustic wave filter 500 of the comparative example.

Figure 8:
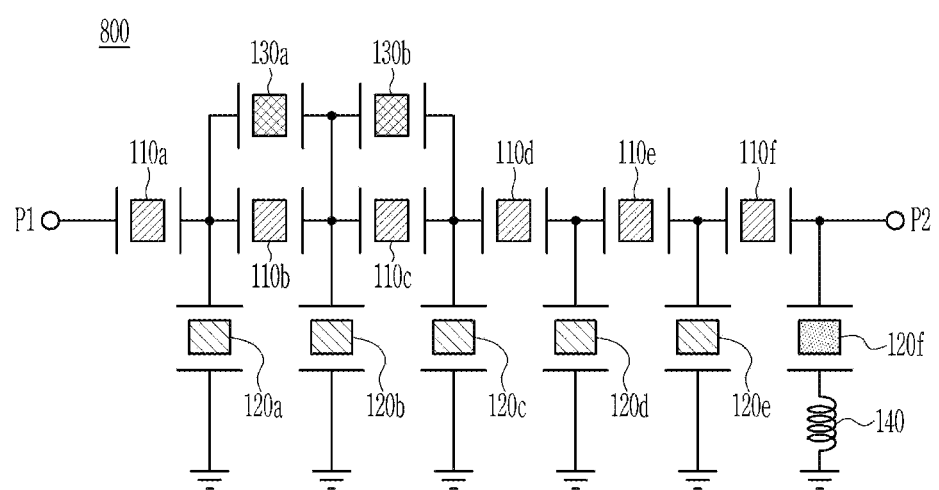
FIG. 8 illustrates a circuit diagram of an acoustic wave filter according to another example.

FIG. 8 illustrates a circuit diagram of an acoustic wave filter according to another example.

Referring to FIG. 8, an acoustic wave filter 800 according to another example includes a plurality of first series resonators 110a, 110b, 110c, 110d, 110e, and 110f, a plurality of shunt resonators 120a, 120b, 120c, 120d, 120e, and 110f, a plurality of second series resonators 130a and 130b, and an inductor 140.

The acoustic wave filter 800 of FIG. 8 is the same as the acoustic wave filter 100 of FIG. 1 except that the acoustic wave filter 100 of FIG. 1 has two second series resonators 130a and 130b.

The second series resonator 130a and the second series resonator 130b may be connected in parallel to different first series resonators among the plurality of first series resonators 110a, 110b, 110c, 110d, 110e, and 110f connected in series between the ports P1 and P2, respectively. As an example, the second series resonator 130a may be connected in parallel to the first series resonator 110b, and the second series resonator 130b may be connected in parallel to the first series resonator 110c.

The resonance frequency of the second series resonators 130a and 130b may have a relationship of Equation 2 and Equation 3. In Equation 2, Fse_a may represent the resonance frequency of the second series resonators 130a and 130b.

Then, the effect obtained by the acoustic wave filter 800 shown in FIG. 8 will be described in detail based on simulation results shown in FIG. 9.

Figure 9:
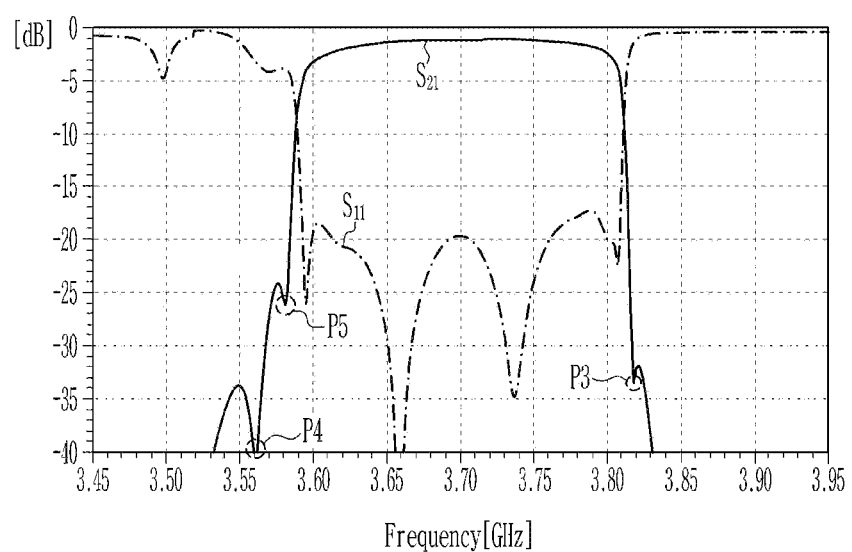
FIG. 9 illustrates a graph of simulation results for reflection loss and insertion loss of the example shown in FIG. 8.

FIG. 9 illustrates a graph of simulation results for reflection loss and insertion loss of the example shown in FIG. 8.

The acoustic wave filter 800 shown in FIG. 8 has a structure in which one more second series resonator 130b is added compared to the acoustic wave filter 100 of the example shown in FIG. 1.

Referring to FIG. 9, the acoustic wave filter 800 may form two poles P4 and P5 in the left band adjacent to the inband, and may form one pole P3 in the right band adjacent to the inband.

For example, assuming that the anti-resonant frequency of the shunt resonators 120a, 120b, 120c, 120d, and 120e is between 3.55 GHz and 3.60 GHz, as the anti-resonant frequencies of the second series resonator 130a and the second series resonator 130b are shifted to different positions at the left side, as shown in FIG. 9, it has two poles P4 and P5 in the left band adjacent to the inband.

Comparing FIG. 3 with FIG. 9, as the acoustic wave filter 800 additionally connects the second series resonator 130b, two poles P4 and P5 are formed in the right band adjacent to the inband. Accordingly, it can be confirmed that the acoustic wave filter 800 shown in FIG. 8 has a more excellent skirt characteristic than the acoustic wave filters 100 and 200 of the examples shown in FIG. 1 and FIG. 2.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter comprising:
a plurality of first series resonators connected in series between a first port and a second port;
a plurality of shunt resonators, each shunt resonators being connected between a different node disposed between the first port and the second port and the ground;
at least one second series resonator connected in parallel to at least one of the first series resonators; and
an inductor connected between one of the shunt resonators and the ground,
wherein a resonant frequency of the at least one second series resonator and a resonant frequency of at least one of the first series resonators are set so that an active area of the at least one second series resonator and an active area of the at least one of the first series resonators do not overlap, the active area representing an area between a resonance point and an anti-resonance point of a corresponding resonator,
wherein a resonant frequency of the shunt resonator connected to the inductor is the same as a resonant frequency of at least one of the plurality of first series resonators.

2. The acoustic wave filter of claim 1, wherein
a resonant frequency of the at least one second series resonator is smaller than a resonant frequency of at least one of the first series resonators.

3. The acoustic wave filter of claim 1, wherein
a resonant frequency of the at least one second series resonator is the same as a resonant frequency of at least one of the shunt resonators except for the shunt resonator connected to the inductor.

4. The acoustic wave filter of claim 1, wherein
a resonant frequency of the shunt resonator connected to the inductor is larger than a resonant frequency of at least one of the shunt resonators except for the shunt resonator connected to the inductor.

5. The acoustic wave filter of claim 1, wherein
the at least one second series resonator includes two second series resonators, and each of the second series resonators is connected to a different first series resonators among the first series resonators.

6. An acoustic wave filter comprising:
a second series resonator connected in parallel to one series resonator of a plurality of first series resonators connected in series between a first port and a second port; and
an inductor connected between the ground and a first shunt resonator among a plurality of shunt resonators connected between a plurality of nodes between the first port and the second port and the ground,
wherein a resonant frequency of the second series resonator and a resonant frequency of the one series resonator are set so that an active area of the second series resonator and an active area of the one series resonator do not overlap, the active area representing an area between a resonance point and an anti-resonance point of a corresponding resonator, and
wherein a resonant frequency of the second series resonator is the same as a resonant frequency of at least one of the shunt resonators except for the first shunt resonator.

7. The acoustic wave filter of claim 6, wherein
a resonant frequency of the first shunt resonator is the same as a resonant frequency of the one first series resonator connected to the second series resonator.

8. The acoustic wave filter of claim 6, wherein
the resonant frequency of the second series resonator is smaller than a resonant frequency of one first series resonator connected to the second series resonator.

9. The acoustic wave filter of claim 6, wherein
a resonant frequency of the first shunt resonator is larger than a resonant frequency of at least one of the shunt resonators except for the first shunt resonator.

10. The acoustic wave filter of claim 6, further comprising
a third series resonator connected in parallel to another one of the plurality of first series resonators,
wherein a resonant frequency of the third series resonator is the same as a resonant frequency of at least one of the shunt resonators except for the first shunt resonator.

* * * * *